United States Patent [19]

Savage, Jr.

[11] 4,195,330
[45] Mar. 25, 1980

[54] LENS CLIP AND CAP FOR LED OR LIGHT UNIT ASSEMBLY

[76] Inventor: John M. Savage, Jr., 8118 W. 83rd St., Apt. C, Playa Del Rey, Calif. 90291

[21] Appl. No.: 907,735

[22] Filed: May 19, 1978

Related U.S. Application Data

[63] Continuation-in-part of Ser. No. 787,016, Apr. 13, 1977, abandoned, which is a continuation-in-part of Ser. No. 638,626, Dec. 8, 1975, abandoned.

[51] Int. Cl.² .................................... H01R 33/00
[52] U.S. Cl. ......................... 362/226; 362/800; 362/311; 362/353; 362/455
[58] Field of Search ............ 362/800, 226, 311, 353, 362/455

[56] References Cited

U.S. PATENT DOCUMENTS 3,774,021   11/1973   Johnson ..................... 362/800 X

*Primary Examiner*—Stephen J. Lechert, Jr.
*Attorney, Agent, or Firm*—William W. Haefliger

[57] ABSTRACT

A light emitting assembly attachable to a display panel includes clip member defining spring fingers projecting rearwardly at the side of a light unit, as for example an LED. The fingers define first grooves to receive a boss on the unit, and second grooves to receive portions of the display panel adjacent a panel opening into which the clip member is inserted. The spring fingers also define first cam surfaces rearwardly of the first grooves and angled to be spread by the unit boss in response to forward insertion of the unit through the clip member and into a lens cap integral with the clip member. The caps may be round or generally rectangular or square in outline, and masks may be employed between caps arranged in a row.

39 Claims, 20 Drawing Figures

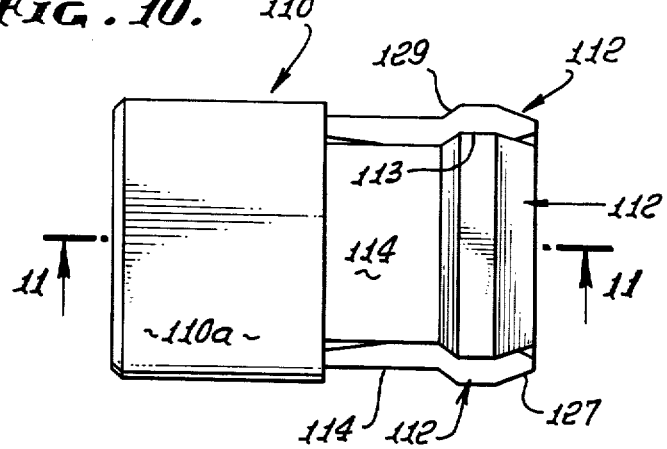
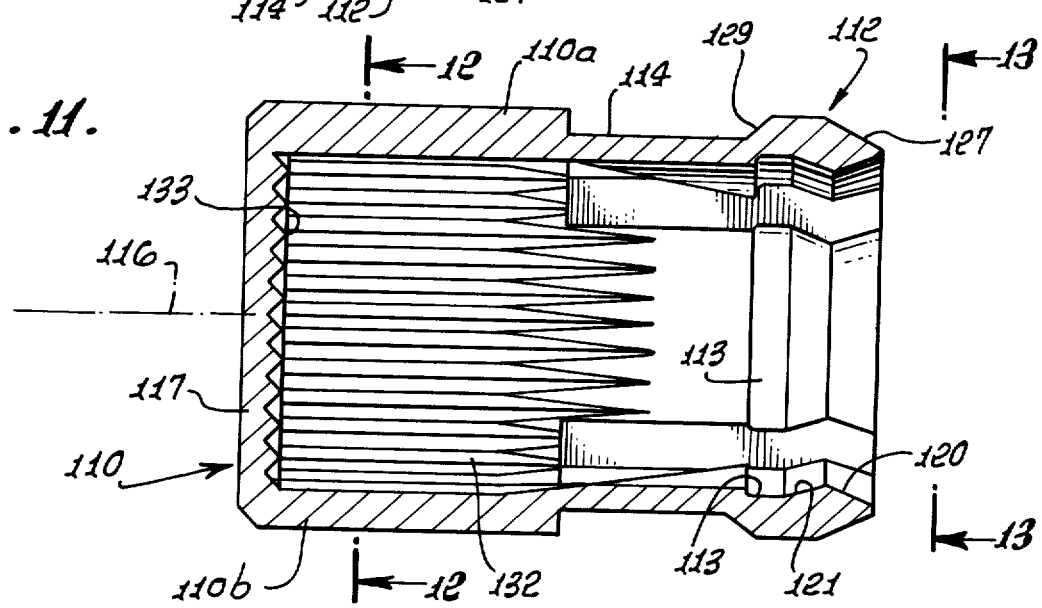
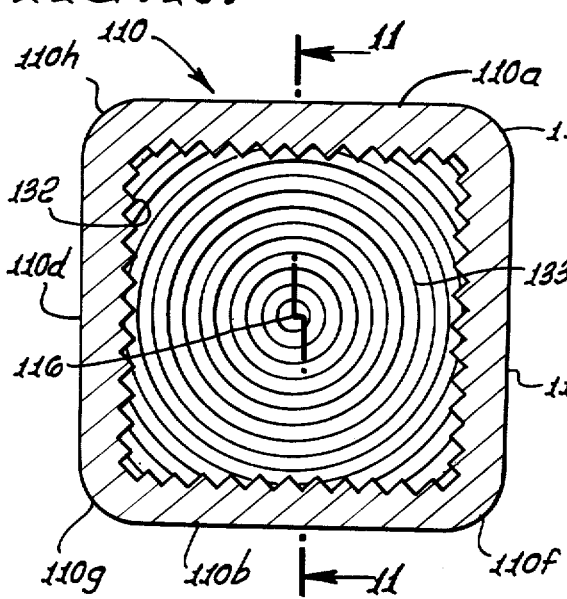
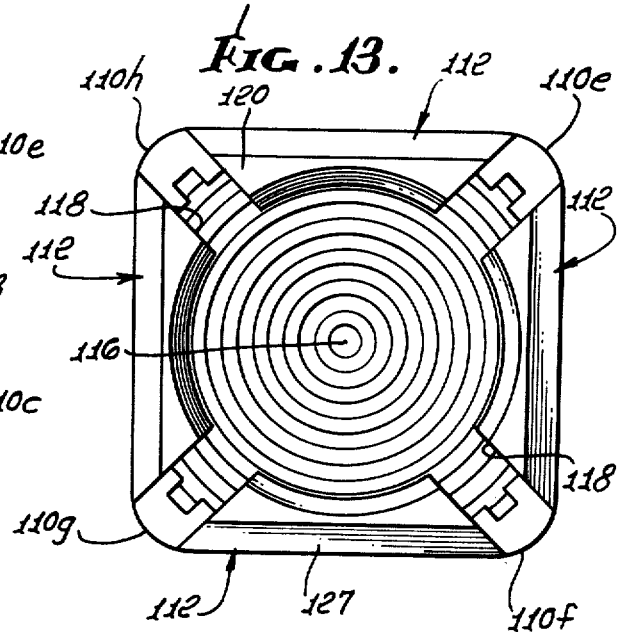

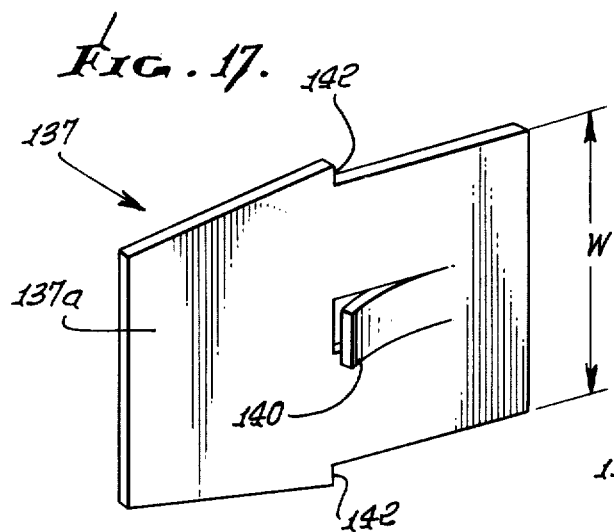
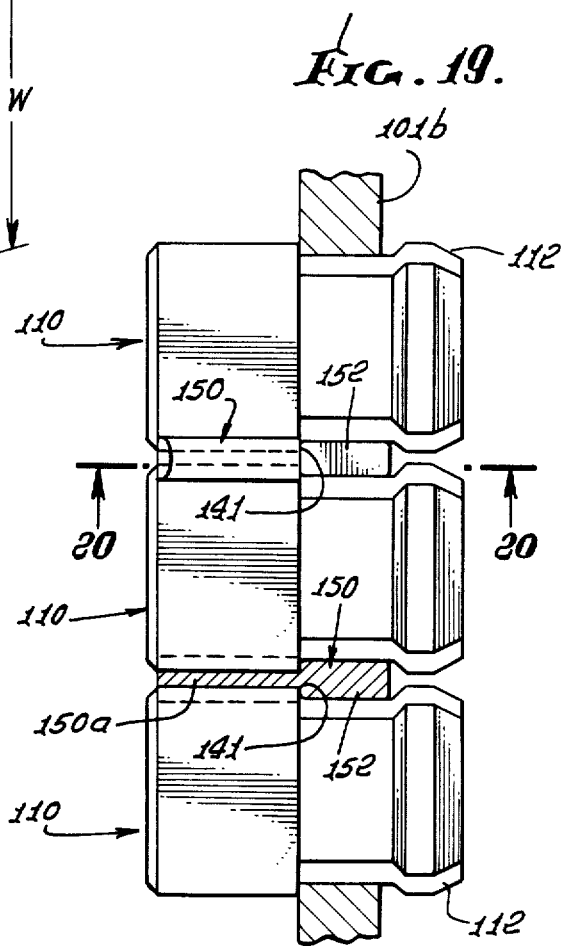
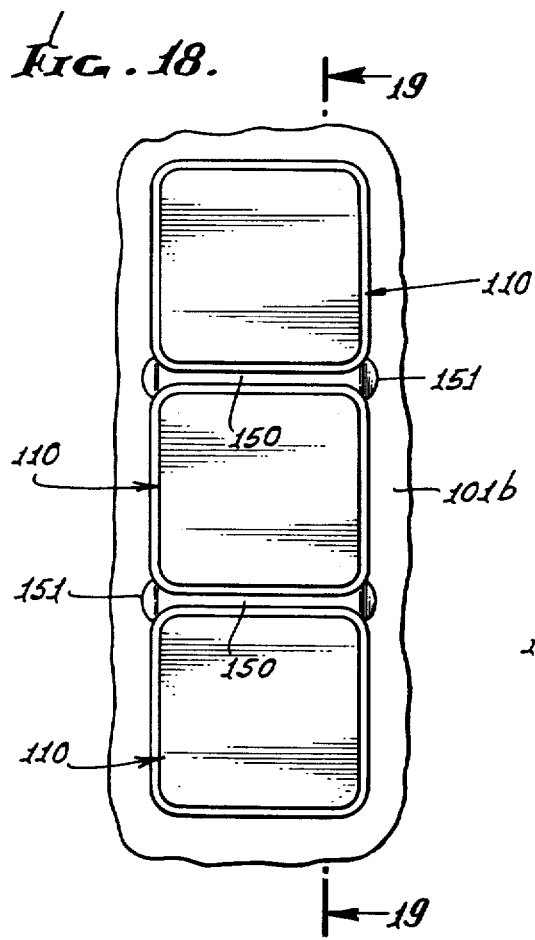
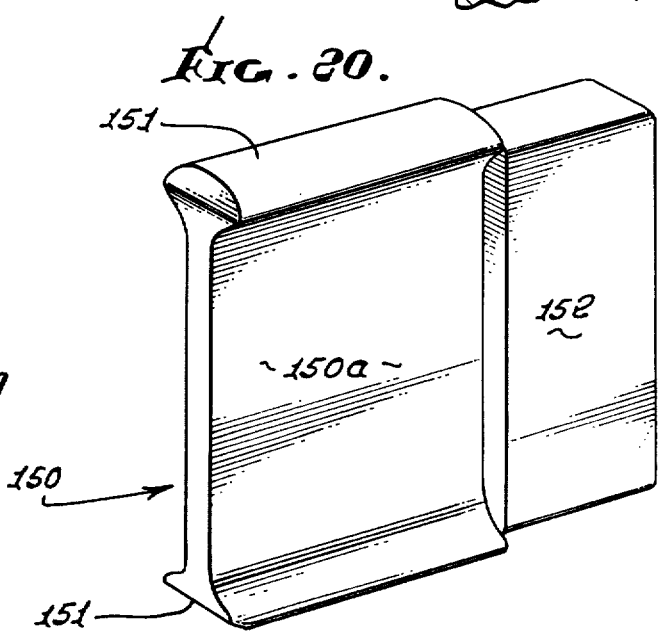

LENS CLIP AND CAP FOR LED OR LIGHT UNIT ASSEMBLY

BACKGROUND OF THE INVENTION

This application is a continuation-in-part of my copending application Ser. No. 787,016 filed Apr. 13, 1977, which was a continuation-in-part of earlier application Ser. No. 638,626 filed Dec. 8, 1975, now both abandoned.

This invention relates generally to light emitting devices and apparatus; more specifically, it concerns the installation or mounting of such devices to overcome prior problems and difficulties.

In the past, LEDs (light emitting diodes) have been permanently mounted within housings, and the latter were in turn attached or mounted to display panels. The construction was such that removal and replacement of the diodes was made quite difficult. U.S. Pat. No. 3,887,803 discloses one way in which to more readily remove a diode from its housing; however, such removal necessitated prior detachment of a lens cap. Also, ready removal of the housing itself from the display panel remained a problem. Further, attachment of the diode to its housing, and the housing to the display panel, in the unusually advantageous manner as now afforded by the invention, were not known.

SUMMARY OF THE INVENTION

It is a major object of the invention to provide an assembly offering a solution to the above as well as other difficulties with prior LED installations, enabling ready installation and/or replacement of diodes and diode housings in display panels. The invention also extends to installations incorporating incandescent type light units. Further, the invention increases the light pattern, gaining the viewer's attention more rapidly, and enhancing aesthetic effect. Basically, the assembly comprises:

(a) a light unit such as an emitting diode or incandescent light unit having locking structure thereon, (b) a lens cap receiving the unit and clip means integral with the cap and projecting proximate the unit locking structure, and (c) a retainer urging said clip means into interfitting relation with said locking structure.

As will be seen, the lens cap typically projects forwardly at one side of the display panel, and the clip means in the form of spring fingers projects through an opening in the panel to releasably interfit the locking structure; and the retainer typically comprises a ring received on the rearwardly projecting fingers to hold them in interfitting relation with the unit, at the opposite side of the panel.

Further, the spring fingers and locking structure may have tongue and groove interfit defined by an annular boss on the unit and first grooves in the spring fingers and presented radially inwardly; the spring fingers may define first cam surfaces angled to be radially spread by the boss in response to forward insertion of the unit into the cap; second cam surfaces angled to be radially spread by the boss in response to rearward retraction of the unit from the cap; third cam surfaces angled to be urged radially inwardly in response to rearward insertion of the spring fingers through the panel opening; and fourth cam surfaces angled to be urged radially inwardly in response to forward retraction of the fingers through the panel opening. In addition, the fingers typically define second grooves to receive portions of the display panel adjacent the panel opening, to retain the fingers and cap in place.

Additional objects include the provision of round or generally rectangular or square caps, the provision of masks between caps arranged in side-by-side relation, and the use of a lens cap having internal serrations so related to the position of a diode within the cap as to optimize external luminosity of the cap in response to energization of the diode.

These and other objects and advantages of the invention, as well as the details of an illustrative embodiment, will be more fully understood from the following description and drawings, in which:

DRAWING DESCRIPTION

FIG. 10 is a side elevation showing a further modified lens cap;

FIG. 11 is an enlarged vertical section taken on lines 11—11 of FIG. 10;

FIG. 12 is a vertical section taken on lines 12—12 of FIG. 11;

FIG. 13 is an end view on lines 13—13 of the FIG. 11 cap;

FIG. 17 is a perspective view of a light mask as incorporated in FIGS. 15 and 16;

FIG. 18 is a frontal elevation showing multiple caps of FIG. 10 form installed in a panel, but with modified light masks between lens caps;

FIG. 19 is a section on lines 19—19 of FIG. 18; and

FIG. 20 is a perspective view of the light stop employed in FIGS. 18 and 19.

DETAILED DESCRIPTION

Figure 1:
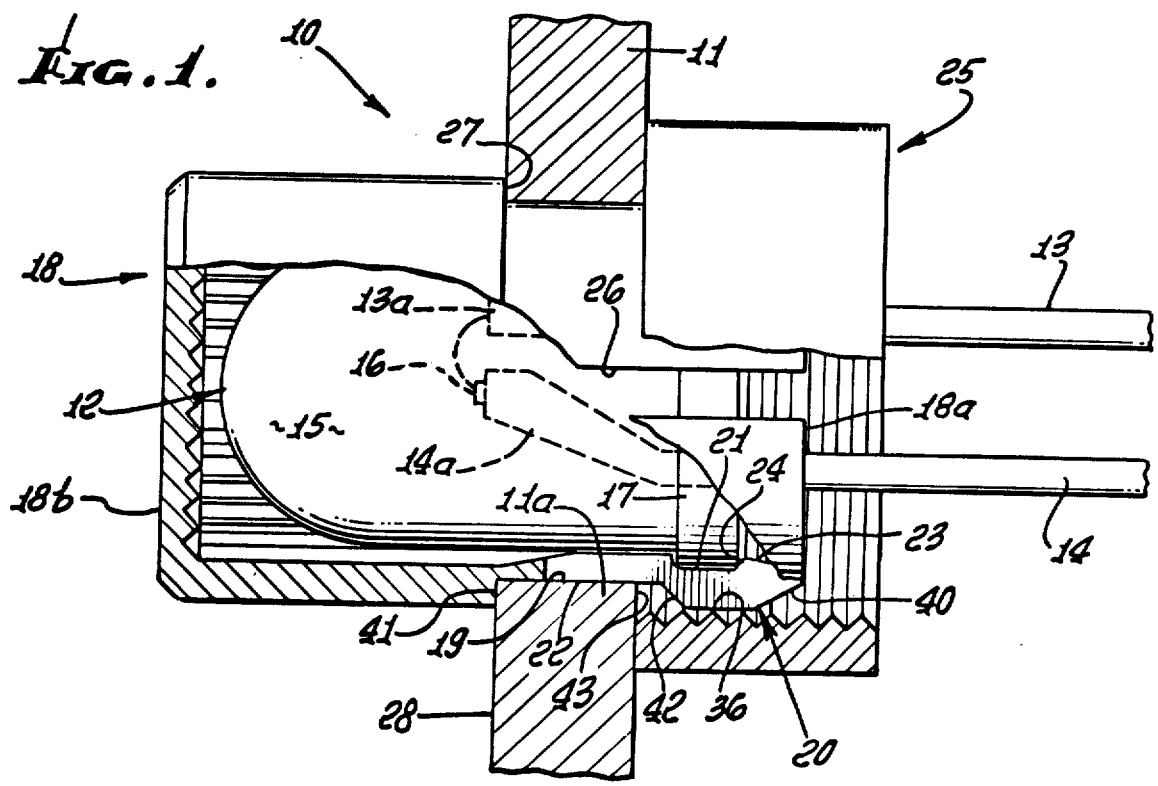
FIG. 1 is a side elevation, partly in section showing the assembly.
Figure 2:
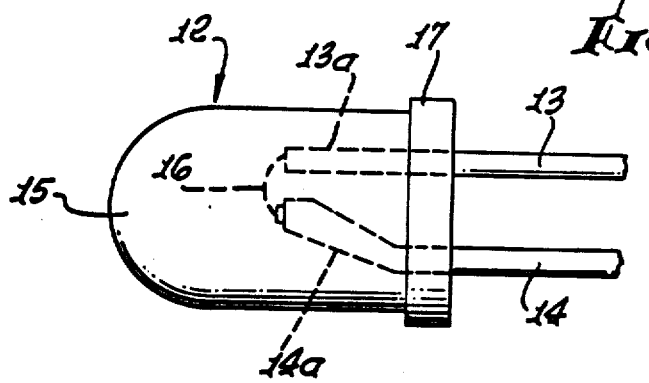
FIG. 2 is a side elevation showing the LED.
Figure 3:
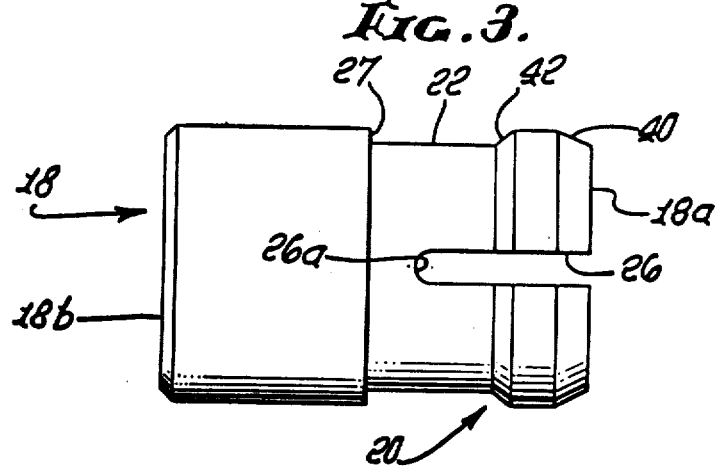
FIG. 3 is a side elevation showing the lens cap.

The light emitting diode assembly 10 seen in FIG. 1 is attached to display panel 11. The LED 12 includes terminals 13 and 14 projecting rearwardly from housing 15, and also within the latter at 13a and 14a. A luminous chip 16 defines the light emitting zone of the LED. The LED also includes locking structure, as for example arcuate boss or flange section 17 at the rearward side of the panel 11.

The assembly also includes a lens cap 18 receiving the diode, and clip means integral with the cap projecting proximate the LED locking structure. The lens cap projects axially at the front side of the panel, and the diode 12 projects axially forwardly through an opening 19 in the panel 11 and within the cap, also at the front side of the panel. The clip means may with unusual advantage comprise spring fingers 20 projecting rearwardly through opening 19 at the outer side of the diode; further, the spring fingers have tongue and groove interfit with the diode, at the rear side of the panel. The illustrated interfit or releasable interconnection is defined by the reception of the radially projecting boss 17 into first grooves 21 defined by cantilevered extents of the fingers projecting rearwardly of the panel 11. Note that the spring fingers also define second grooves 22 receiving portions 11a of the panel 11 adjacent the circular opening 19.

The fingers 20 further define first cam surfaces 23 located rearwardly of the grooves 21 to be radially spread by the diode boss 17 in response to forward insertion of the diode into the cap. Surfaces 23 are angled rearwardly and radially outwardly, as shown. In addition the fingers define second cam surfaces 24 immediately rearward of the grooves 21 and angled rearwardly and radially inwardly to be radially spread apart by the diode boss 17 in response to relatively rearward retraction of the diode from the cap.

Retention of the diode boss in grooves 21 is assured by a retainer urging the clip means spring fingers into interfitting relation with the diode locking structure, i.e., boss 17. As shown, the retainer may comprise a ring 25 having a circumferentially serrated bore 36 in frictional engagement with the spring fingers.

It should be noted that four spring fingers 20 may be provided by forming four lengthwise extending slits 26 in the skirt portion of the cap, at 90° intervals about the cap axis. The slits extend forwardly or leftwardly from the rightward end 18a of the cap. The leftward ends 26a of the slits terminate within the bore or opening 19 in the display panel, and to the right of an annular cap shoulder 27 which seats against the face 28 of the panel, and which defines the leftward end of groove 22. The cap is held in that seated position by the frictional grip of the retainer serrations 36 against the spring fingers. In that position, the cap holds the diode itself so that the light zone defined by luminous chip 16 is proximate the plane defined by face 28.

Figure 4:
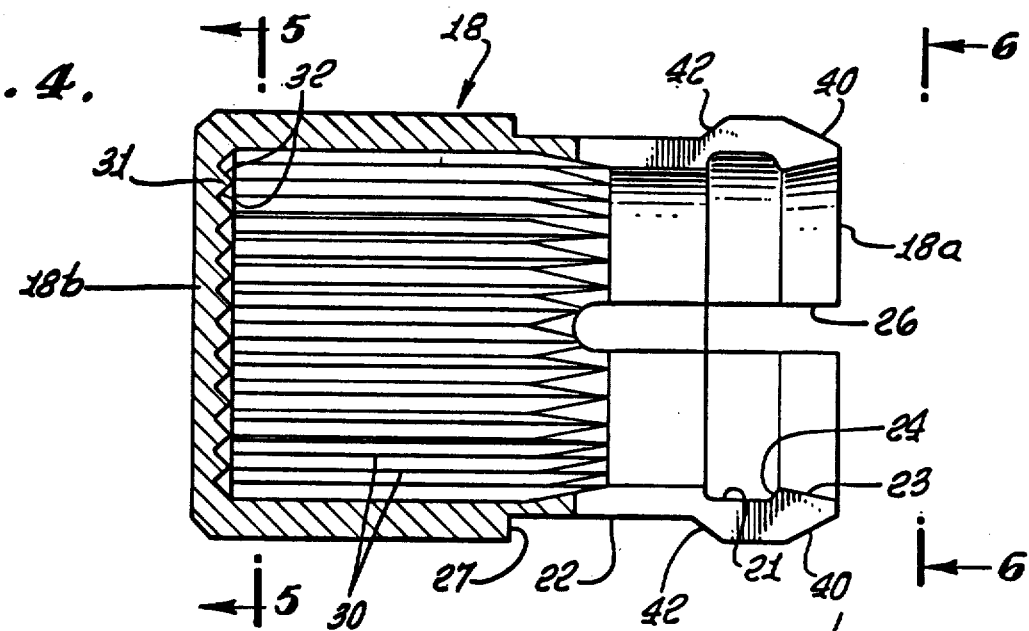
FIG. 4 is vertical section through the FIG. 3 cap.
Figure 5:
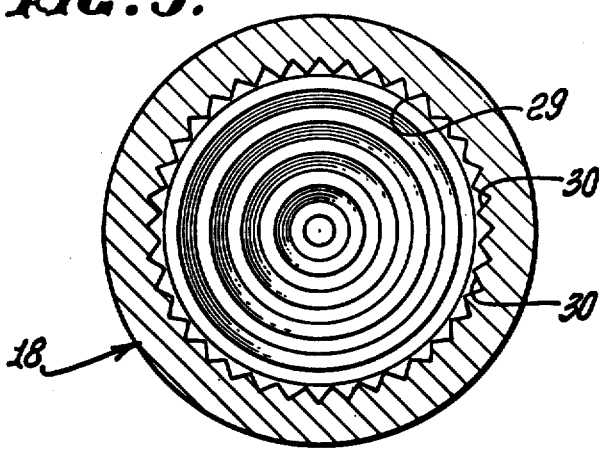
FIG. 5 is a section on lines 5—5 of FIG. 4.

Referring to FIGS. 4 and 5, the lens cap 18 has a flat forwardly or leftwardly presented end 18b. Also, the interior bore of the cap defines axially extending, circumferentially spaced serrations 29. Opposed walls 30 of each serration-rib extend at about 90°. Similarly, the cap interior front wall defines radially spaced, circular serrations 31 with opposed walls 32 of each serration extending at about 90°. Such walls refract the light transmitted from the diode through the cap, for providing increased luminosity at local areas of the cap, when viewed from the exterior.

Figure 7:
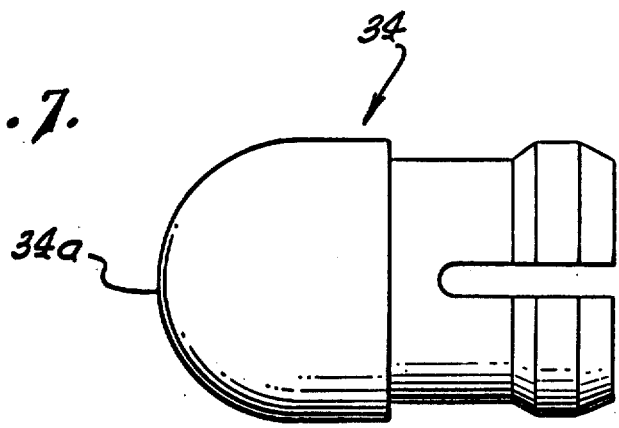
FIG. 7 is a side elevation showing a modified lens cap.

Finally, FIG. 7 illustrates a cap 34 similar to cap 18, but having a leftwardly domed forward end 34a.

FIG. 1 also shows that the spring fingers 20 define third cam surfaces 40 rearwardly of the secnd grooves 22, and angled rearwardly and radially inwardly to be urged radially inwardly by edge portions 41 of the panel in response to rearward installation of the spring fingers through the opening 19; also, the fingers define fourth cam surfaces 42 rearwardly of and adjacent the grooves 22, surfaces 42 being angled rearwardly and radially outwardly to be urged inwardly by edge portions 43 of the panel in response to forward retraction of the fingers through opening 19. Accordingly, the spring fingers accommodate ready installation of the lens cap 18 to a panel, as well as ready removal of the cap from the panel, without the diode being located within the cap; and ready installation of the diode into the installed cap as well as ready removal of the diode from the installed cap.

The lens caps and clip means described herein, and the retainer ring, may consist of any suitable plastic material.

Figure 8:
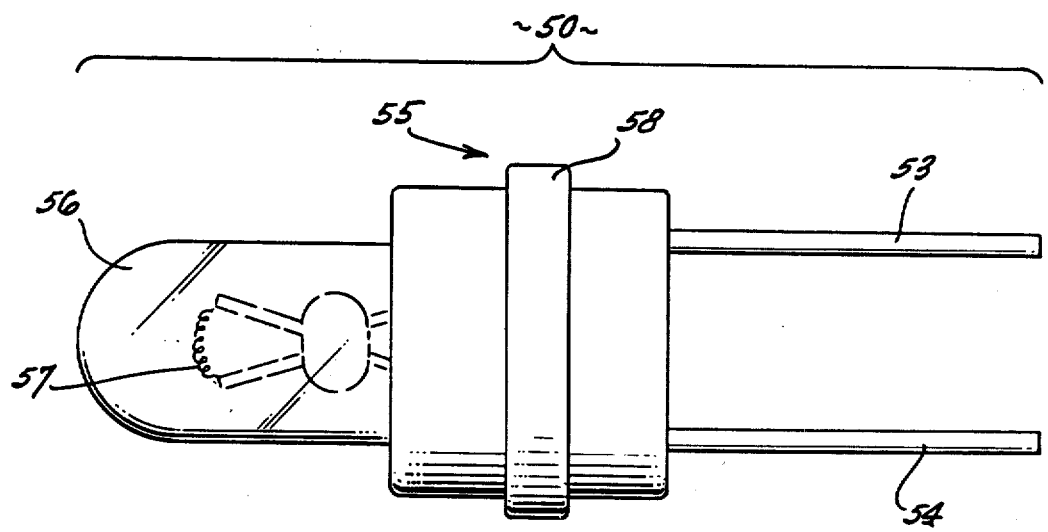
FIG. 8 is a view like FIG. 2 showing an incandescent lamp embodiment.
Figure 9:
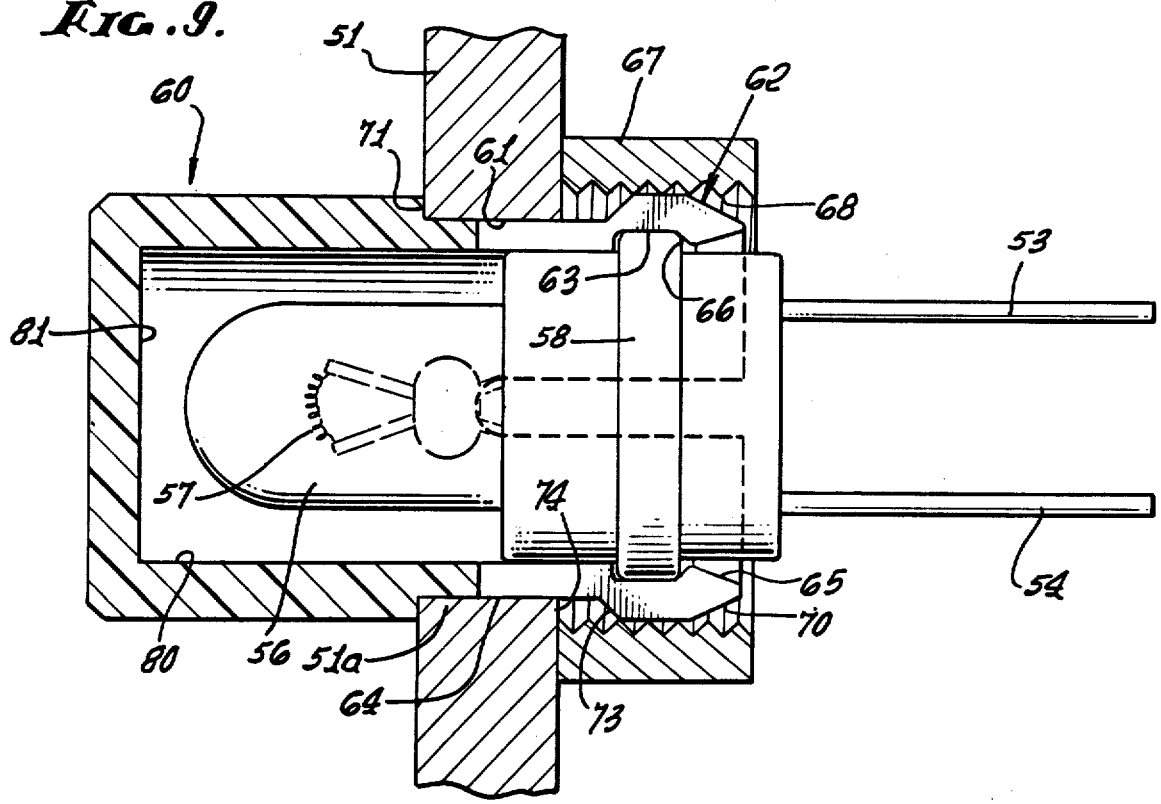
FIG. 9 is a view like FIG. 1 showing the FIG. 8 embodiment installed in a panel.

The light unit assembly of FIGS. 8 and 9 includes a light unit 50 attached to panel 51 and includes terminals 53 and 54 projecting rearwardly from a body 55 to which transparent envelope 56 is attached to project leftwardly (forwardly). A resistive component, such as wire 57, within the envelope is adapted to be electrically energized to incandescence, to define a light emitting zone. The unit 50 also includes locking structure such as annular boss or flange 58 at the rearward side of panel 51.

The assembly also includes a lens cap 60 receiving the envelope 56, and a clip member or means integral with the cap projecting proximate the light unit locking structure. Cap 60 projects axially at the front side of the panel, and the envelope 56 projects axially forwardly through an opening 61 in the panel 51 and within the cap, also at the front side of the panel. The clip member may comprise spring fingers 62 projecting rearwardly through opening 61 at the rearward side of envelope 56; further, the fingers have tongue and groove interfit with the light unit, as at the rear side of the panel. For example, boss 58 is received into first grooves 63 defined by cantilevered extents of the fingers projecting rearwardly of the panel. The fingers also define second grooves 64 receiving portions 51a of the panel adjacent circular opening 61.

The fingers further define first cam surfaces 65 located rearwardly of the grooves 63 to be radially spread by the boss 58 in response to forward insertion of the light unit into the cap. Surfaces 65 are angled rearwardly and radially outwardly as shown. In addition, the fingers define second cam surfaces 66 immediately rearwardly of the grooves 63 and angled rearwardly and radially inwardly to be radially spread apart by the boss 58 in response to relatively rearward retraction of the light unit from the cap.

Retention of boss 58 in grooves 63 is assured by a retainer urging the fingers 62 into interfitting relation with the locking structure, i.e. boss 58. As shown, the retainer may comprise a ring 67 having a circumferentially serrated bore 68 in frictional engagement with the fingers. As before, four such fingers may be provided, with slits therebetween.

The fingers also define third cam surfaces 70 rearwardly of grooves 64, and angled rearwardly and radially inwardly to be urged radially inwardly by edge portions 71 of the panel in response to rearward installation of the fingers through opening 61. Also, the fingers define fourth cam surfaces 73 rearwardly of and adjacent grooves 64. Surfaces 73 are angled rearwardly and radially outwardly to be urged inwardly by edge portions 74 of the panel in response to forward retraction of the fingers throu h opening 61. Accordingly, the fingers accommodate ready installation of the lens cap 60 to a panel, as well as ready removal of the cap from a panel, without the light unit being located within a cap; and ready installation of the light unit into the installed cap as well as ready removal of the unit from the installed cap.

The translucent cap 60 may consist of plastic material, and typically has a smooth bore 80 and inner end face 81.

Figure 14:
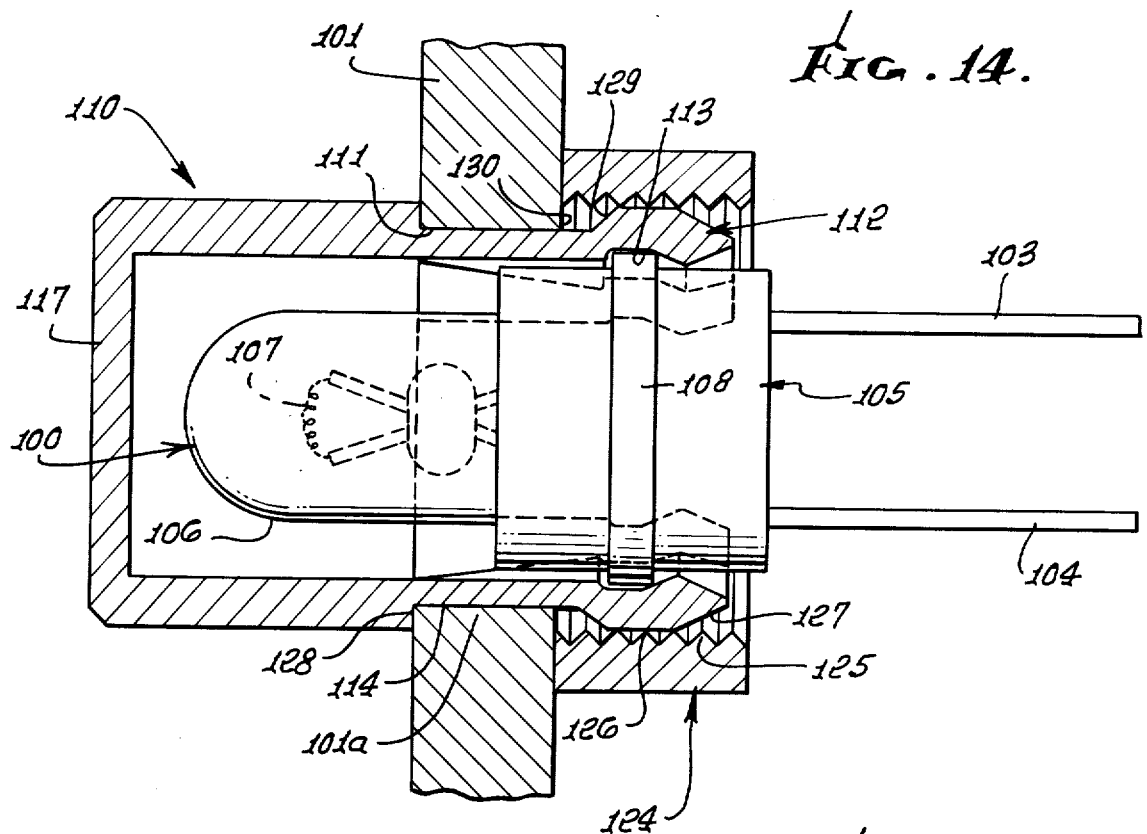
FIG. 14 is a view like FIGS. 1 and 9 showing the FIG. 10 embodiment installed in a panel.

FIG. 14 shows a light unit 100 attached to panel 101, and having terminals 103 and 104 projecting rearwardly from body 105 to which transparent envelope 106 is attached to project leftwardly (forwardly). A resistive component, such as wire 107, within the envelope is adapted to be electrically energized to incandescence, to define a light emitting zone. Unit 100 also includes locking structure such as annular boss or flange 108 at the rearward side of panel 101. The unit might alternatively take the form of the LED unit, or a Neon bulb.

The illustrated assembly also include a lens cap 110 receiving the envelope 106, and a clip member or means integral with the cap projecting proximate the light unit locking structure. Cap 110 projects axially at the front side of the panel, and the envelope 106 projects axially forwardly through an opening 111 in the panel 101, and within the cap, also at the front side of the panel. The clip member may comprise spring fingers 112 projecting rearwardly through opening 111 at the rearward side of the envelope 106; further, the fingers have tongue and groove interfit with the light unit. For example, boss 108 is received into first grooves 113 defined by cantilevered extents of the fingers projecting rearwardly of the panel. The fingers also define second grooves 114 receiving portions 101a of the panel adjacent rectangular or square opening 111.

In this regard, it will be observed that the cap defines a forward axis 116 (see FIGS. 11-13), and has opposite exterior side walls, at least two of which are substantially parallel and flat. See for example walls 110a and 110b, and/or walls 110c and 110d. The outer sides of these walls are flat, as shown, and they are joined at corners 110e-110h which are locally rounded, as shown. The cap is generally rectangular, and preferably square, in external outline or cross section normal to axis 116. The end wall 117 of the cap is also flat, and perpendicular to axis 116. There are, correspondingly, four fingers 112, each in general rearward alignment with one of the cap walls, as is clear from FIGS. 11 and 13. The outer walls of the fingers are flat, whereas their inner sides are circularly arcuate, about axis 116. Slits 118 separate the fingers, the slits located in rearward alignment with the cap corners 110e-110h referred to. Grooves 114 are, accordingly, flat as is clear from FIGS. 10 and 11, whereas grooves 113 are arcuate.

The fingers further define first arcuate cam surfaces 120 located rearwardly of the grooves 113 to be radially spread by boss 108 in response to forward insertion of the light unit into the cap. Surfaces 120 are angled rearwardly and radially outwardly as shown. In addition, the fingers define second arcuate cam surfaces 121 immediately rearwardly of the grooves 113, and angled rearwardly and radially inwardly to be radially spread apart by the boss 108 in response to relatively rearward retraction of the light unit from the cap.

Retention of the boss 108 in grooves 113 is assured by retainer ring 124 having a generally square cross section, with four sets of serrations 125 in frictional engagement with the respective four fingers, at locations 126.

The fingers also define third cam surfaces 127 rearwardly of grooves 114, and angled rearwardly and radially inwardly to be urged radially inwardly by edge portions 128 of the panel in response to rearward installation of the fingers through opening 111. Also, the fingers define fourth cam surfaces 129 rearwardly of and adjacent to grooves 114. Surfaces 129 are angled rearwardly and radially outwardly to be urged inwardly by edge portions 130 of the panel in response to forward retraction of the fingers through opening 111; however, surfaces 129 normally block such retraction until the fingers are inwardly collapsed. Accordingly, the fingers accommodate ready installation of the lens cap 110 to a panel with a rectangular or square opening 111, as well as ready removal of the cap from the panel, without the light unit being located within the cap; and ready installation of the light unit into the installed cap as well as ready removal of the unit from the installed cap.

Figure 6:
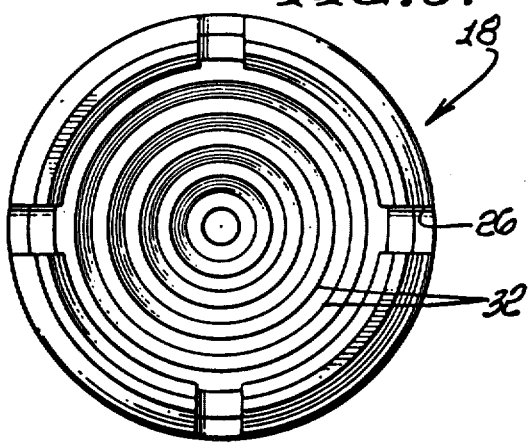
FIG. 6 is an elevation on lines 6—6 of FIG. 4.

Cap 110 may consist of plastic material, and is shown in FIG. 14 without interior serrations. The serrations shown at 132 and 133 in FIGS. 11-13 serve the same purposes as serrations 29 and 31 in FIGS. 4-6.

Figure 15:
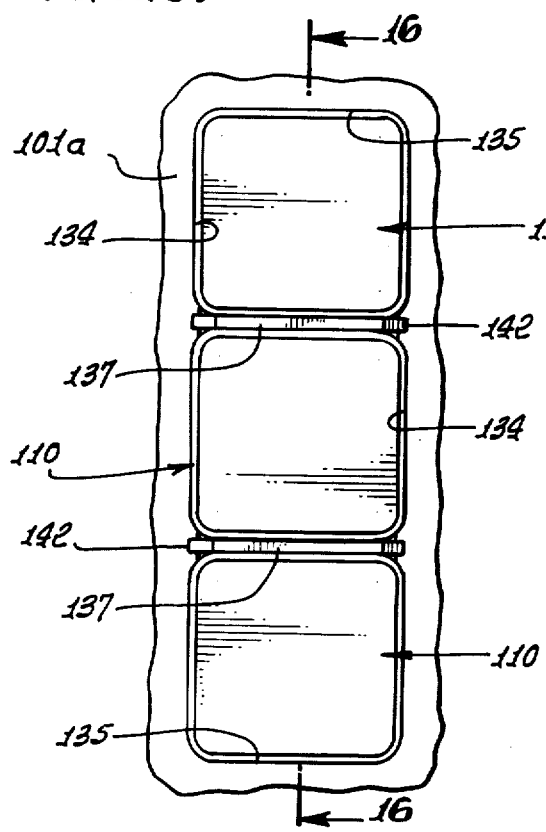
FIG. 15 is a frontal elevation showing multiple caps of FIG. 10 form installed in a panel.
Figure 16:
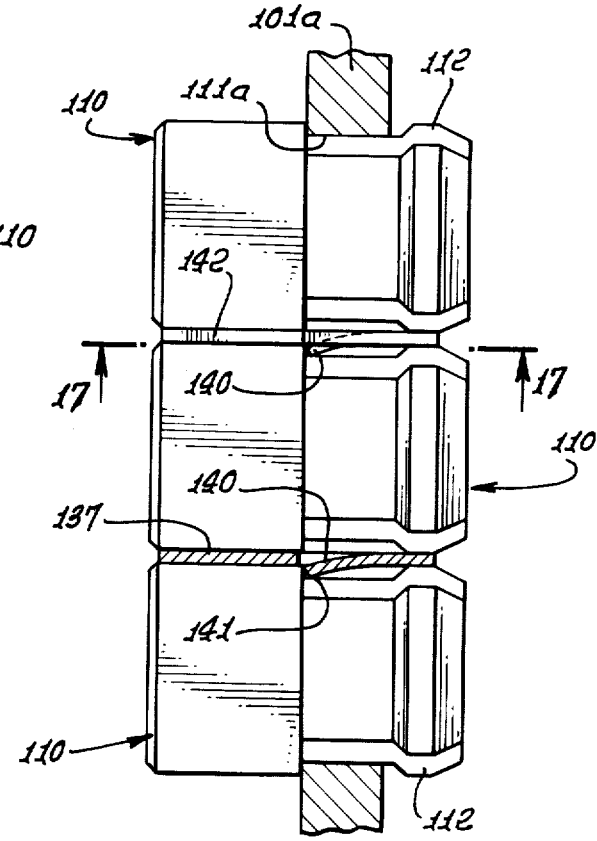
FIG. 16 is a section on lines 16—16 of FIG. 15.

FIGS. 15 and 16 show a row of three caps 110 installed in panel 101a. Note the straight side walls 134 of the opening 111a receiving the caps, as well as straight parallel end walls 135. At least two fingers 112 of each cap engage panel walls, for retention. The caps extend proximate or adjacent one another in the row, and light masks may be installed between the caps, i.e. in the slight gaps between them. The masks are illustrated at 137, and as further seen in FIG. 17. They may consist of opaque plastic material to block light transmission between the caps. A tang 140 extends sidewardly from the flat body of the mask to engage the underside of the cap, at 141 in FIG. 16, which overhangs a groove 114, whereby the mask is held in position against inadvertent removal. In addition, mask tangs 142 seat on the edge portion of the panel adjacent edges 134. The width "w" of the lower portion of the mask is such that it fits nicely in the space between edges 134. Mask tapered portion 137a is located between the caps 110 to block light transmission.

In FIG. 18, the caps 110 are arranged in a row in an opening in the panel 101b, with modified masks 150 between them. Such masks are better shown in FIG. 20 as having enlargements 151 at opposite ends of body portions 150a, the enlargement filling the space between curved corners of the caps. Mask lower portions 152 are enlarged to fit against cap undersides 141, blocking withdrawal of the masks from between the caps. Enlargements fit against the top edges of the panel opening. Accordingly, efficient arrangement of caps in side-by-side relation may be made, with light masks therebetween, whereby selective lighting of areas (without noticeable discontinuities) may be achieved.

I claim:

1. In a light emitting diode assembly attachable to a display panel, said assembly comprising:
   (a) a light emitting diode, having locking structure thereon, said structure defining a boss,
   (b) a lens cap receiving the diode forwardly therein, clips means integral with the cap and projecting sidewardly proximate the diode locking structure,
   (c) said clip means defining spring fingers projecting rearwardly at the side of the diode, the fingers defining first grooves to receive the boss on the diode and second grooves to receive portions of the display panel adjacent an opening formed therein, and wherein,
   (d) the spring fingers define first cam surfaces rearwardly of the first grooves and angled to be radially spread by the diode boss in response to forward insertion of the diode into the cap.

2. The assembly of claim 1 including a retainer having the form of a ring receiving and extending about said fingers.

3. The assembly of claim 2 including said panel having said opening therethrough, said lens cap interfitting the panel and projecting into said opening.

4. The assembly of claim 3 wherein the retainer engages the panel.

5. In a light emitting diode assembly attachable to a display panel, said assembly comprising:
   (a) a light emitting diode, having locking structure thereon,
   (b) a lens cap receiving the diode, clip means integral with the cap and projecting proximate the diode locking structure, said structure defining an annular boss,
   (c) a retainer holding said clip means in interfitting relation with said diode locking structure,
   (d) the cap defining an axis, the diode projecting axially forwardly within the cap, and the clip means comprising spring fingers projecting rearwardly at the side of the diode, and wherein
   (e) the retainer comprises a ring having a serrated bore in frictional engagement with the spring fingers, and the fingers define grooves releasably receiving said annular boss on the diode, inwardly of the ring.

6. The assembly of claim 1 wherein the lens cap has a domed forwardly presented end.

7. The assembly of claim 1 wherein the lens cap has a flat forwardly presented end.

8. The assembly of claim 1 wherein the lens cap defines an axis and has an interior side wall defining axially extending serrations, the cap being translucent.

9. The assembly of claim 8 wherein the lens cap has an interior front end wall defining radially spaced serrations which extend circularly about said axis.

10. The assembly of claim 5 including said panel having an opening therethrough, said lens cap interfitting the panel and projecting into said opening.

11. The assembly of claim 10 wherein said ring has a serrated bore, and engages the panel.

12. In a light emitting diode assembly attachable to a display panel, said assembly comprising:
   (a) a light emitting diode, having locking structure thereon,
   (b) a lens cap receiving the diode, clip means integral with the cap and projecting proximate the diode locking structure,
   (c) a retainer in the form of a ring holding said clip means in interfitting relation with said diode locking structure, and wherein
   (d) the cap defines an axis, the diode projecting axially forwardly within the cap, and the clip means comprising spring fingers projecting rearwardly at the side of the diode, the spring fingers having tongue and groove interfit with the diode, inwardly of the retainer ring, said tongue and groove interfit being defined by a radially projecting annular boss on the diode, and first grooves defined by the fingers and receiving said boss, the spring fingers defining second grooves to receive portions of the display panel adjacent an opening formed therein, the spring fingers also defining first cam surfaces rearwardly of the first grooves and angled to be radially spread by the diode boss in response to forward insertion of the diode into the cap.

13. The assembly of claim 1 wherein the fingers define second cam surfaces rearwardly of the first grooves and angled to be radially spread by the diode boss in response to rearward retraction of the diode from the cap.

14. For use in a light emitting assembly attachable to a display panel, said assembly comprising
   (a) a light unit having locking structure thereon, said structure defining a boss and a light transmitting envelope forwardly of the boss, the improvement comprising
   (b) a lens cap for receiving the envelope forwardly therein, clip means integral with the cap and projecting sidewardly proximate the locking structure,
   (c) said clip means defining spring fingers projecting rearwardly at the side of the unit, the fingers defining first grooves to receive the boss and second grooves to receive portions of the display panel adjacent an opening formed therein, and wherein
   (d) the spring fingers defining first cam surfaces rearwardly of the first grooves and angled to be radially spread by said boss in response to forward insertion of said envelope into the cap.

15. The assembly of claim 14 including said light unit which includes a resistive component within the envelope and adapted to be electrically energized to incandescence.

16. The assembly of claim 15 wherein the lens cap extends generally coaxially with said unit, the cap being translucent.

17. The assembly of claim 14 wherein the fingers define second cam surfaces rearwardly of the first grooves and angled to be radially spread by said boss in response to rearward retraction of the unit to remove the envelope from within the cap.

18. The assembly of claim 14 including said panel having said opening therethrough, said lens cap interfitting the panel and projecting into said opening.

19. The assembly of claim 14 wherein said cap has a smooth interior wall surface, the cap being translucent.

20. The assembly of claim 1 wherein the cap defines a forward axis and has opposite exterior side walls which are substantially parallel and flat.

21. The assembly of claim 20 wherein the cap has generally rectangular external cross section in planes normal to said axis.

22. The assembly of claim 21 wherein said fingers are separated by forwardly extending slits rearwardly of corners defined by said cap generally rectangular external cross section.

23. The assembly of claim 20 including a light mask adjacent one of said flat side walls.

24. The assembly of claim 1 including a light mask adjacent the side of said cap.

25. The assembly of claim 5 wherein the cap defines a forward axis and has opposite exterior side walls which are substantially parallel and flat.

26. The assembly of claim 25 wherein the cap has generally rectangular external cross section in planes normal to said axis.

27. The assembly of claim 26 wherein said fingers are separated by forwardly extending slits rearwardly of corners defined by said cap generally rectangular external cross section.

28. The assembly of claim 25 including a light mask adjacent one of said flat side walls.

29. The assembly of claim 14 wherein the cap defines a forward axis and has opposite exterior side walls which are substantially parallel and flat.

30. The assembly of claim 29 wherein the cap has generally rectangular external cross section in planes normal to said axis.

31. The assembly of claim 30 wherein said fingers are separated by forwardly extending slits rearwardly of corners defined by said cap generally rectangular external cross section.

32. The assembly of claim 29 including a light mask adjacent one of said flat side walls.

33. In combination:
 (a) multiple lens caps adapted to receive light units, said caps including spring fingers projecting rearwardly and configured to interfit display panel means, and
 (b) said caps extending in a row, and there being light masks between adjacent caps.

34. The combination of claim 33 wherein each cap defines a forward axis and has opposite exterior side walls which are flat and substantially parallel, the masks located between said flat walls on adjacent caps.

35. The combination of claim 34 wherein said masks include tangs interfitting said caps to position the masks.

36. The combination of claim 34 wherein the masks include enlargements adjacent exterior corners defined by said caps.

37. The combination of claim 34 wherein each cap has a generally rectangular exterior cross section in planes normal to a forward axis defined by the cap.

38. In combination
 (a) multiple lens caps adapted to receive light units, caps including spring fingers projecting rearwardly and configured to interfit the light units and display panel means,
 (b) said caps extending in a row, successive caps located proximate one another,
 (c) each cap having a generally rectangular cross section in planes normal to a forward axis defined by the cap.

39. The combination of claim 38 including said panel means interfitting said spring fingers.

* * * * *